(12) United States Patent
Andersson

(10) Patent No.: US 10,666,231 B2
(45) Date of Patent: May 26, 2020

(54) BALUN ARRANGEMENT

(71) Applicant: Telefonaktiebolaget LM Ericsson (publ), Stockholm (SE)

(72) Inventor: Kristoffer Andersson, Göteborg (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 16/341,972

(22) PCT Filed: Oct. 27, 2016

(86) PCT No.: PCT/EP2016/075919
§ 371 (c)(1),
(2) Date: Apr. 15, 2019

(87) PCT Pub. No.: WO2018/077409
PCT Pub. Date: May 3, 2018

(65) Prior Publication Data
US 2019/0245520 A1    Aug. 8, 2019

(51) Int. Cl.
*H03H 11/32* (2006.01)
*H01P 5/10* (2006.01)
*H01P 3/08* (2006.01)

(52) U.S. Cl.
CPC ............ *H03H 11/32* (2013.01); *H01P 3/08* (2013.01); *H01P 3/081* (2013.01); *H01P 5/10* (2013.01)

(58) Field of Classification Search
CPC . H03H 11/32; H01P 3/08; H01P 3/081; H01P 5/10; H01P 3/082
See application file for complete search history.

(56) References Cited

U.S. PATENT DOCUMENTS 6,009,314 A    12/1999  Björk et al.
7,068,122 B2 * 6/2006  Weng .................. H01P 5/10
                                                333/246

(Continued)

OTHER PUBLICATIONS

Fathelbab, W. et al., "New Classes of Miniaturized Planar Marchand Baluns", IEEE Transactions on Microwave Theory and Techniques, vol. 53 No. 4, Apr. 1, 2005, pp. 1211-1220, IEEE.

(Continued)

*Primary Examiner* — Jung Kim
(74) *Attorney, Agent, or Firm* — Coats + Bennett, PLLC

(57) ABSTRACT

The present disclosure relates to a balun arrangement (1, 1', 1") comprising a single-ended port (2, 2; 17, 26), a differential port arrangement (61), a coupled first and second transmission line section (5, 6) constituting a first coupled pair (7), and a third and fourth coupled transmission line section (8, 9) constituting a second coupled pair (10). The first transmission line section (5) is connected between a first coupled pair first port (11) and the third transmission line section (8), the second transmission line section (6) is connected between a first coupled pair second port (12) and the first differential port (3), the third transmission line section (8) is connected between a second coupled pair first port (13) and the first transmission line section (5), and the fourth transmission line section (9) is connected between a second coupled pair second port (14) and the second differential port (4). For one coupled pair (7, 10), the first port (11, 13) is connected to the single-ended port (2, 2; 17, 26), and the second port (12, 14) is connected to ground. For the other coupled pair (10, 7), the first port (13, 11) is connected to ground, and the second port (14, 12) is connected to open circuit (15, 15').

12 Claims, 8 Drawing Sheets

(56) References Cited

U.S. PATENT DOCUMENTS

| | | |
|---|---|---|
| 10,181,629 B2 * | 1/2019 | Anegawa .................. H01P 5/10 |
| 2002/0022458 A1 | 2/2002 | Gill |
| 2016/0197393 A1 | 7/2016 | Kuroda |

OTHER PUBLICATIONS

Schindler, M. et al., "DC-40 GHz and 20-40 GHz MMIC SPDT Switches", IEEE Transactions on Electron Devices, vol. ED-34 No. 12, Dec. 1, 1987, pp. 2595-2602, IEEE.

Zhang, H. et al., "Design of Dual-Band Coupled-Line Balun", 2011 International Workshop on Antenna Technology (iWAT), Mar. 7, 2011, pp. 332-335, IEEE.

Lin, C. et al., "Analysis of Multiconductor Coupled-Line Marchand Baluns for Miniature MMIC Design", IEEE Transactions on Microwave Theory and Techniques, vol. 55 No. 6, Jun. 1, 2007, pp. 1190-1199, IEEE.

* cited by examiner

BALUN ARRANGEMENT

TECHNICAL FIELD

The present disclosure relates to a balun arrangement comprising a single-ended port, a differential port arrangement, a first coupled transmission line pair and a second coupled transmission line pair.

BACKGROUND

In many fields of communication, as well as in radar applications, interfacing front-ends to related circuitry in active array antennas is required. The front-end of a pulsed radar or time division duplex communication system typically includes a transmit branch and a receive branch. The transmit branch generally consists of a driver amplifier, power amplifier and filtering, while the receive branch generally consist of a low noise amplifier and a signal filtering arrangement. A transmit/receive switch device is used to select branch depending on whether the front-end should receive or transmit signals.

The performance of such a radar or communication system is heavily dependent on transmitted output power, power added efficiency in transmit mode, and noise figure in receiving mode. The transmit/receive switch of the front-end is thus a critical component since it must be designed to both withstand high output power while providing low-loss in order to minimize noise figure and maximize power added efficiency.

Active array antennas, either in a radio communications or a radar system, may require that a plurality of front-ends are placed in a tight grid; typically with half the operating wavelength apart. For active array antennas that require very high output power, it is not feasible to integrate a large number of front-ends in single-chip. Instead, the front-ends need to be placed on a carrier board and connected to a beam-former using transmission lines on the carrier board. For a transceiver front-end, either two separate receive and transmit lines or a bi-directional transmit/receive line can be used. The latter would require less routing area at the cost of increased loss in the extra transmit/receive switch required in the beam-former and front-end.

U.S. Pat. No. 6,009,314 discloses transmit/receive switch interfacing circuits having differential outputs/inputs to a single-ended antenna. For an alternative arrangement, a differential low-level interface, e.g. from a beam-former, is interfaced to single-ended circuits, e.g. power amplifiers and low noise amplifiers.

For highly integrated circuits made using silicon technologies, e.g. CMOS (Complementary Metal Oxide Semiconductor) and/or SiGe (Silicon Germanium), it is common practice to use differential interfaces rather than single-ended interfaces. Differential interfaces increase the output power, lowers parasitic inductance and increases isolation. The main drawback is that the transmit/receive switch in the front-end must be duplicated which increases front-end size and incurs extra loss.

There is thus a desire to provide transmit/receive switches for a differential bi-directional interface in the front-end circuit with decreased loss. Such a switch normally comprises a balun (balanced-unbalanced) arrangement, for example as described in "New Classes of Miniaturized Planar Marchand Baluns" by Wael M. Fathelbab, and Michael B. Steer, IEEE Transactions on Microwave Theory and Techniques, vol, 53, No. 4, April 2005. There is a desire to provide an enhanced balun arrangement that enables transmit/receive switches for a differential bi-directional interface in the front-end circuit to be designed with lower loss.

SUMMARY

It is an object of the present disclosure to provide an enhanced balun arrangement that enables transmit/receive switches for a differential bi-directional interface in the front-end circuit to be designed with lower loss.

Said object is obtained by means of a balun arrangement comprising:
a single-ended port;
a differential port arrangement comprising a first differential port and a second differential port;
a first transmission line section and a second transmission line section which are electromagnetically mutually coupled such that a first coupled pair is obtained; and
a third transmission line section and a fourth transmission line section which are electromagnetically mutually coupled such that a second coupled pair is obtained.

For the balun arrangement:
the first transmission line section is connected between a first coupled pair first port and the third transmission line section;
the second transmission line section is connected between a first coupled pair second port and the first differential port;
the third transmission line section is connected between a second coupled pair first port and the first transmission line section; and
the fourth transmission line section is connected between a second coupled pair second port and the second differential port.

Furthermore, for one coupled pair out of the first coupled pair and second coupled pair, the first port is connected to the single-ended port, and the second port is connected to ground. and, for the other coupled pair out of the first coupled pair and second coupled pair, the first port is connected to ground, and the second port is connected to open circuit.

Such a balun arrangement confers many advantages, an important advantage is that transmit/receive switches for a differential bi-directional interface in a front-end circuit are enabled to be designed with lower loss.

According to an example, the balun arrangement further comprises a first switching arrangement, a second switching arrangement, a third switching arrangement and a fourth switching arrangement.

For the first coupled pair:
The first port is connected to a first switch port and the first switching arrangement that is arranged to switch the first port and the first switch port to open circuit, in a first switch state, or to ground, in a second switch state.
The second port is connected to the second switching arrangement that is arranged to switch the second port to ground, in the first switch state, or to open circuit, in the second switch state.
For the second coupled pair:
The first port is connected to a second switch port and the third switching arrangement that is arranged to switch the first port and the second switch port to ground, in the first switch state, or to open circuit, in the second switch state.

The second port is connected to the fourth switching arrangement that is arranged to switch the second port to open circuit, in the first switch state, or to ground, in the second switch state, This results in that in the first switch state, the first switch port constitutes the single-ended port, and, in the second switch state, the second switch port constitutes the single-ended port.

Here, the balun arrangement constitutes an advantageous low-loss switch device for a differential bi-directional interface in a front-end circuit. In the first switch state, the second switch port will be isolated from the first switch port, and, in the second switch state the first switch port will be isolated from the second switch port.

According to another example, the switching arrangements are constituted by switching transistors and/or switching diodes and/or combinations of switching transistors and/or switching diodes.

This provides the advantage that standard components can be used for the low-loss switch device.

According to another example, the first switch port is a transmitter port and the second switch port is a receiver port. In the first switch state, the transmitter port is connected to the differential port arrangement, and in the second switch state, the receiver port is connected to the differential port arrangement.

This provides the advantage that the low-loss switch device can be used as a transmit/receive switch device.

According to another example, the transmission line sections are constituted by microstrip transmission lines formed on a dielectric layer.

This provides the advantage that the balun arrangement can be manufactured in a cost-effective manner.

According to another example, the coupled transmission line sections of each coupled pair are formed on opposite sides of a dielectric layer together with the switching arrangements.

This provides the advantage that the balun arrangement can be manufactured in a cost-effective and area-effective manner.

According to another example, the coupled transmission line sections are constituted by transmission lines formed in a stripline configuration, sandwiched between two dielectric layers together with the switching arrangements.

This provides the advantage that the balun arrangement can be manufactured in a cost-effective manner with low leakage.

Said object is also obtained by means of a transceiver device comprising a balun arrangement according to the above.

This means that a transceiver device that can be conferred all the above advantages is provided.

BRIEF DESCRIPTION OF THE DRAWINGS

The present disclosure will now be described more in detail with reference to the appended drawings, where.

DETAILED DESCRIPTION

A challenging problem in active antenna arrays is to fit the active RF (Radio Frequency) electronics within the lattice spacing as dictated by the half wavelength antenna to antenna separation in an array. This problem can be divided in two parts: size of the electronic circuits and the associated routing. For a solution were the amplitude and phase control is integrated in one circuit, e.g. a beam-former, and the power amplifier and low noise amplifier is integrated in a separate circuit, the RF routing between these two circuits can pose a considerable problem. For example, say a given beam-former comprises four channels. These channels can be routed using uni-directional interfaces; one separate port for receive mode and another for transmit mode. For a four channel beam-former with uni-directional interfaces a total of 8 RF ports need to be routed to the front-end circuitry. This number can be reduced to four if the beam-former uses bi-directional interfaces.

High performance integrated beam-former RFIC:s (RF Integrated Circuits), either using CMOS or SiGe, are constructed using differential circuit topologies. These differential circuits are then converted to single-ended operation inside the beam-former or using off-chip baluns, on the PCB or elsewhere. The main reason to convert to single-ended operation is that high-performance MMIC (Monolithic Microwave Integrated Circuit), in GaAs (Gallium Arsenide) and/or GaN (Gallium Nitride), typically are not made for differential operation. Furthermore, narrowband antenna designs are usually driven by single-ended interfaces.

Figure 1:
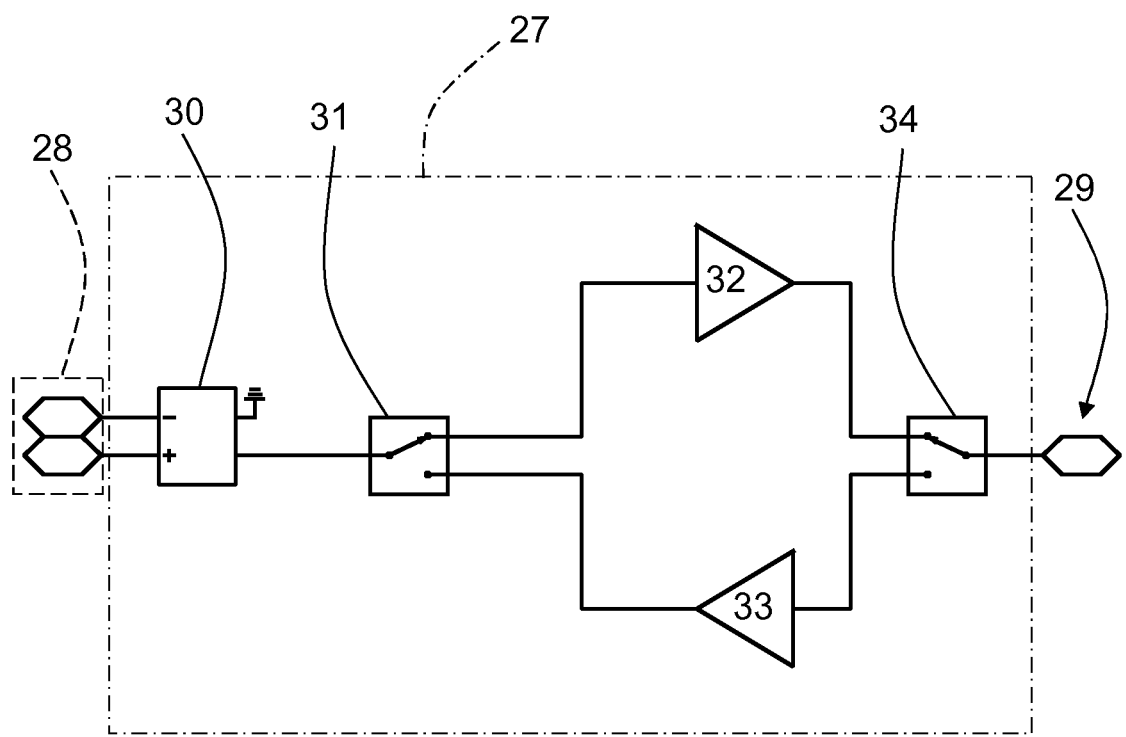
FIG. 1 shows a block diagram of a typical transmit/receive front-end arrangement.

In the following, the description will be directed towards interfacing a differential interface, e.g. from a beam-former, to single-ended circuits, e.g. power amplifiers and low noise amplifiers. FIG. 1 shows a circuit diagram of a typical transmit/receive front-end arrangement 27 adapted for interfacing between a differential operation and a single-ended operation. The front-end arrangement 27 comprises a balanced bi-directional input/output interface 28 and a single-ended common interface 29, which may, e.g., be used as an antenna port. The interfaces are connected to each other via a balun 30, a first switch 31, a transmitter amplifier 32, a receiver amplifier 33 and a second switch 34. The switches 31, 34 are arranged to switch between the transmitter amplifier 32 and the receiver amplifier 33.

The problem of interfacing differential signals is expected to increase in importance. High performance DAC:s and ADC:s are often differentially interfaced, and with direct RF sampling techniques becoming available at microwave and mm-wave frequencies, the front-end circuitry will have to interface to these differential circuits.

Figure 2:
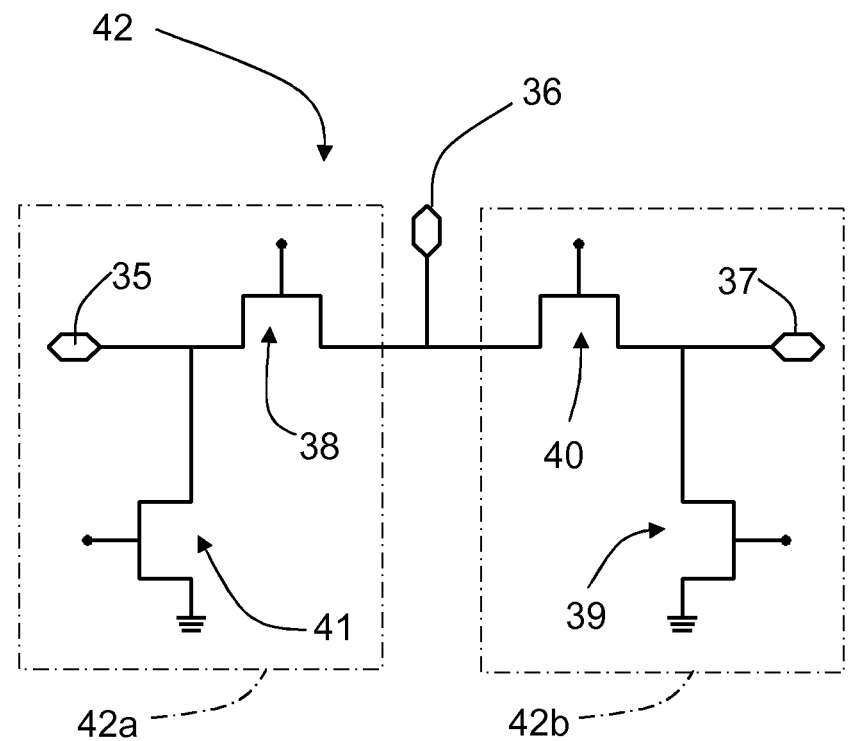
FIG. 2 shows a circuit diagram of a transmit/receive switch.

Broadband transmit/receive switches are typically implemented as shunt-series switches; FIG. 2 shows a circuit diagram of a transmit/receive switch 42 where a first port 35 is switched to a single-ended port 36 while keeping a second port 37 isolated by turning on a first transistor 38 and a second transistor 39 and turning off a third transistor 40 and a fourth transistor 41. The main switching action is provided by the serially connected first transistor 38 and third transistor 40 while the shunt connected second transistor 39 and fourth transistor 41 provide isolation. The on-resistance of the serially connected transistors 38, 40 sets the insertion loss, where a low on-resistance provides low insertion loss. The transmit/receive switch 42 can be divided symmetrically in a first transmit/receive switch part 42a and second transmit/receive switch part 42b, where the first transmit/receive switch part 42a comprises the first port 35, the first transistor 38 and the fourth transistor 41, and where the second transmit/receive switch part 42b comprises the second port 37, the second transistor 39 and the third transistor 40.

However, to achieve low on-resistance, these transistors 38, 40 need to be relatively large, hence increasing the capacitance which will degrade the isolation. Hence there is a tradeoff between insertion loss and isolation. There is a similar tradeoff also for the shunt connected transistors 39, 41 but that can be mitigated by absorbing the capacitance in a synthetic transmission line. In this context, a synthetic transmission line is a transmission line where a line series inductance per unit length is increased or a line shunt capacitance per unit length is decreased to maintain a desired line impedance when the transmission line is loaded with a transistor capacitance.

For mm-wave operation, according to some aspects the term mm-wave refers to frequencies above 18 GHz, and mm-wave operation thus refers to transceiver operations at such frequency bands, the off-state leakage in the serially connected transistors 38, 40 makes the shunt-series switch impractical since the isolation is relatively poor and the insertion loss is relatively high.

Figure 3:
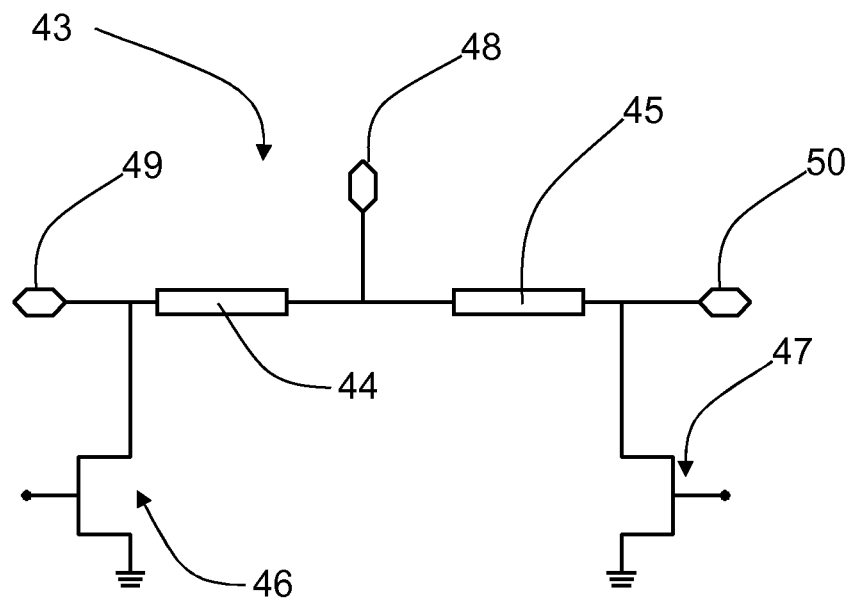
FIG. 3 shows a circuit diagram of an alternative transmit/receive switch.

FIG. 3 shows a circuit diagram of a transmit/receive switch 43 that can be used at these frequencies. Here, quarter wavelength transmission lines 44, 45 and shunt connected switch transistors 46, 47 provide an improved trade-off between isolation and insertion loss. The basic principle of this switch 43 is using two impedance inverters, here implemented as a first quarter wavelength transmission line 44 and a second quarter wavelength transmission line 45 connected to a single-ended port 48 at one end and forming two arms connected to a corresponding first port 49 and second port 50. At the end of these arms, each inverter is loaded with a corresponding shunt connected first transistor 46 and shunt connected second transistor 47. For example, to switch the first port 49 to the single-ended port 48, while keeping the second port 50 isolated, the shunt connected first transistor 46 at the first port 49 is turned off, and the shunt connected fourth transistor 47 at the second port 50 is closed. The impedance inverter in the second arm will now transform the low impedance at the second port 50 to a high impedance as seen at the single-ended port 48.

The transmit/receive switches 42, 43 discussed above in connection to FIG. 2 and FIG. 3 can, for example, be used as the first switch 31 and the second switch 34 discussed above in connection to FIG. 1.

Regarding baluns, there exists a plethora of balun circuits. Microwave and mm-wave baluns implemented in RFIC or MMIC relies on either edge coupled lines or broadside coupled lines. Depending on the operating frequency, these lines can then be inter wound and/or spiralized. For MMIC implementation, due to limited number of metallization layers, the most common implementation is edge coupled lines, while broadside coupling is typically used in RFIC.

Figure 4:
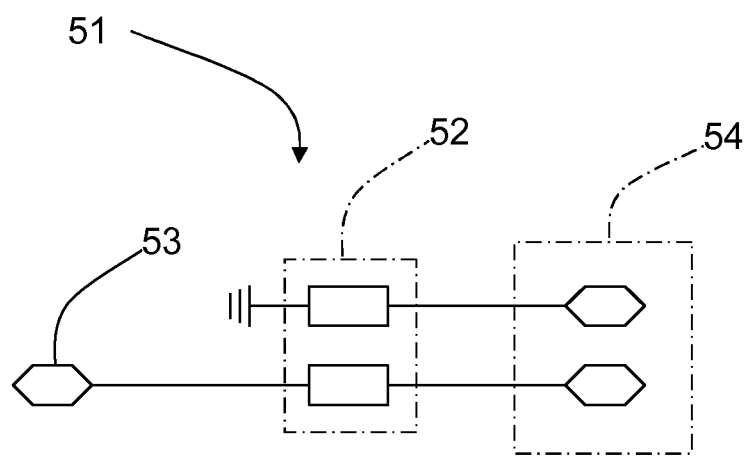
FIG. 4 shows a circuit diagram of a coupled line balun.

FIG. 4 shows a circuit diagram of a coupled line balun 51 comprising a single section coupled line quarter wavelength transmission line pair 52, an unbalanced port 53 and a balanced port 54.

Figure 5:
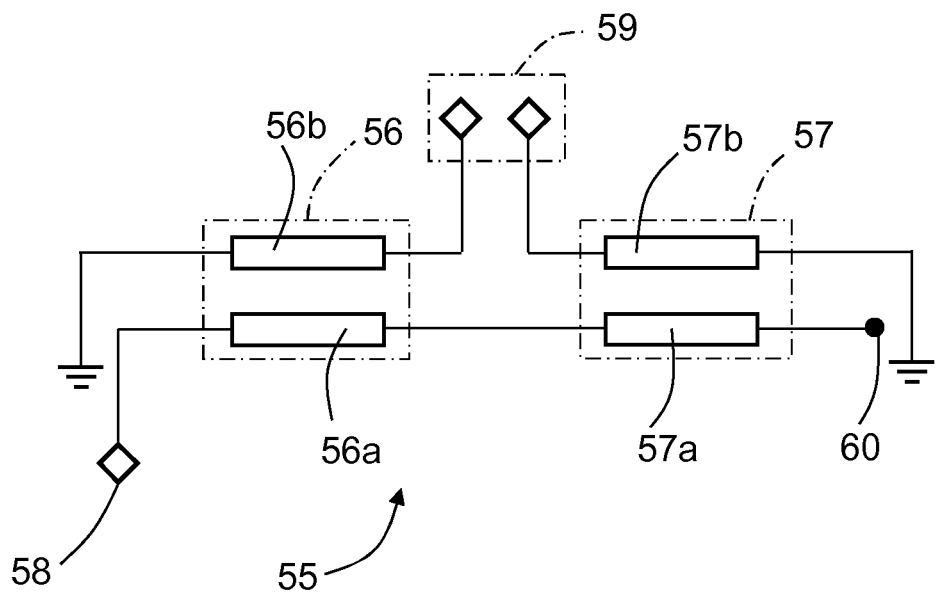
FIG. 5 shows a circuit diagram of a Marchand balun.

Another common configuration is the so-called Marchand balun as shown in a circuit diagram in FIG. 5. Here, the Marchand balun 55 comprises a first coupled transmission line pair 56 a second coupled transmission line pair 57, an unbalanced port 58 and a balanced port 59. The first coupled transmission line pair 56 comprises a first transmission line section 56a and a second transmission line section 56b which are electromagnetically coupled to each other. Correspondingly, the second coupled transmission line pair 57 comprises a third transmission line section 57a and a fourth transmission line section 57b which are electromagnetically coupled to each other. All transmission line sections 56a, 56b; 57a, 57b have a longitudinal extension of a quarter wavelength.

A single-ended signal is fed to the first transmission line section 56a, and the third transmission line section 57a, which transmission line sections 56a, 57a are connected in series, where the third transmission line section, 57a is terminated in an open circuit 60. A differential signal is extracted from the second wavelength transmission line section 56b and the fourth transmission line section 57b, where each of these transmission line sections 56b, 57b is terminated in a short circuit.

Figure 6:
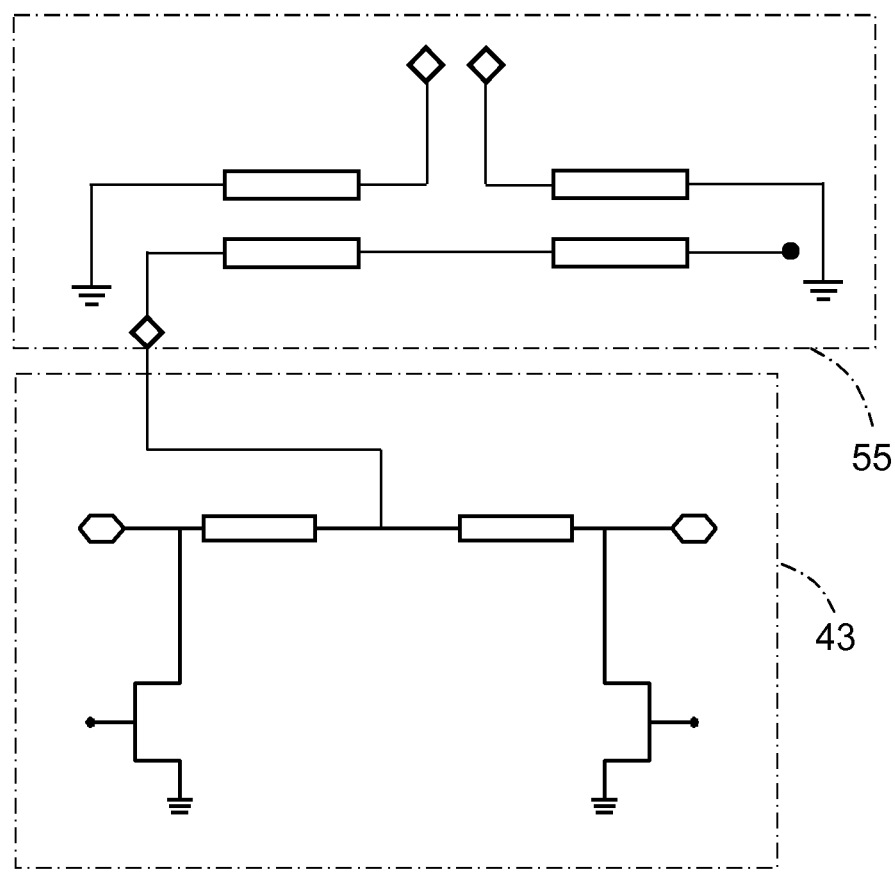
FIG. 6 shows a circuit diagram of a Marchand balun combined with the transmit/receive switch according to FIG. 3.

FIG. 6 shows a first realization of a Marchand balun 55 combined with the transmit/receive switch 43 according to FIG. 3. This implementation has a relatively high insertion loss due to the compound action of the balun loss and the transistor loss. This combination is also relatively large.

Figure 7:
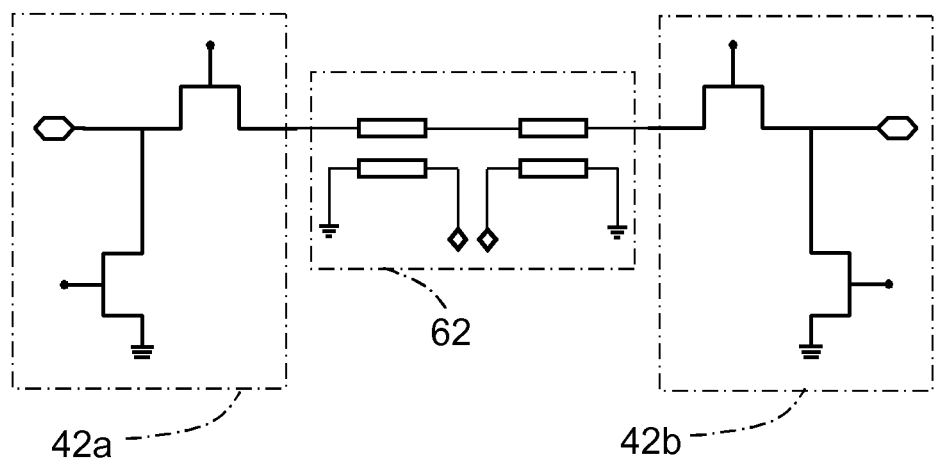
FIG. 7 shows a circuit diagram of a Marchand balun combined with the transmit/receive switch according to FIG. 2.

FIG. 7 shows a second realization of a Marchand balun 62 combined with transmit/receive switches 42a, 42b according to FIG. 2. The Marchand balun 62 is now placed between the first transmit/receive switch part 42a and the second transmit/receive switch part 42b, and the symmetry of the half wave length line in the Marchand balun 62 is now being re-used. This configuration is more compact than the one shown in FIG. 6. However, at mm-wave frequencies, the isolation of the serially connected transistors in off-state is relatively poor, which would impede the performance of both the transmit/receive switch 42a, 42b and the Marchand balun 62. Furthermore, this configuration still incurs the compound loss of both the transmit/receive switch 42a, 42b and the Marchand balun 62.

According to the present disclosure, a modified Marchand balun is used where the single-ended line is terminated in a short circuit such that the open- and short-circuit locations are reversed compared to the Marchand balun previously discussed with reference to FIG. 5. This modified Marchand balun will be described more in detail in the following, and has similar performance as a conventional Marchand balun, for example the Marchand balun previously discussed with reference to FIG. 5.

Figure 8A:
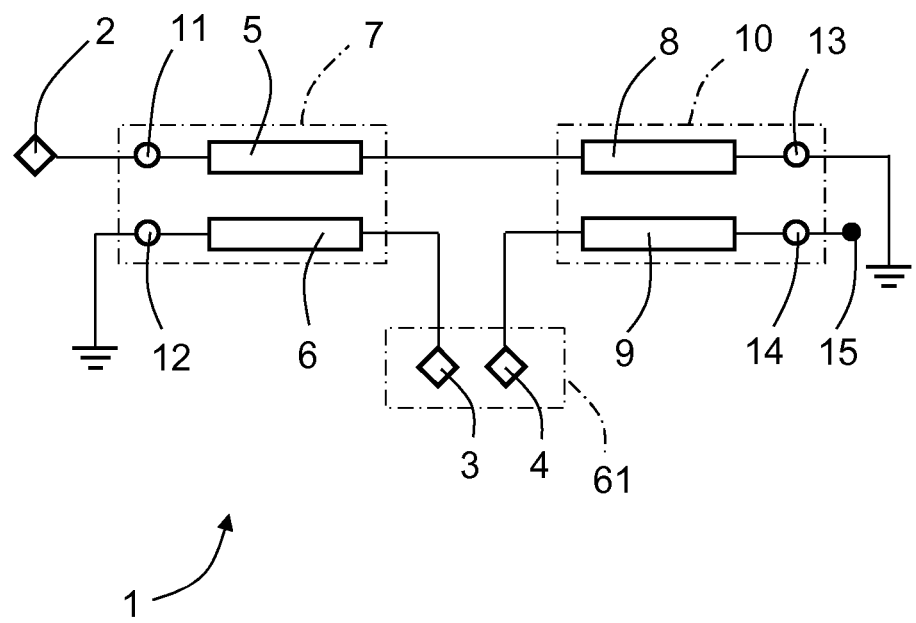
FIG. 8a shows a circuit diagram of a first balun arrangement according to the present disclosure.

With reference to FIG. 8a, the modified Marchand balun, constituting a first balun arrangement 1, comprises:
- a single-ended port 2;
- a differential port arrangement 61 comprising a first differential port 3 and a second differential port 4;
- a first transmission line section 5 and a second transmission line section 6 which are electromagnetically mutually coupled such that a first coupled pair 7 is obtained; and
- a third transmission line section 8 and a fourth transmission line section 9 which are electromagnetically mutually coupled such that a second coupled pair 10 is obtained.

Furthermore,
- the first transmission line section 5 is connected between a first coupled pair first port 11 and the third transmission line section 8;
- the second transmission line section 6 is connected between a first coupled pair second port 12 and the first differential port 3;
- the third transmission line section (8) is connected between a second coupled pair first port 13 and the first transmission line section 5; and
- the fourth transmission line section 9 is connected between a second coupled pair second port 14 and the second differential port 4.

According to the present disclosure, for the first coupled pair 7, the first port 11 is connected to the single-ended port 2, and the second port 12 is connected to ground; and for the second coupled pair 7, the first port 13 is connected to ground, and the second port 14 is connected to open circuit 15.

Figure 8B:
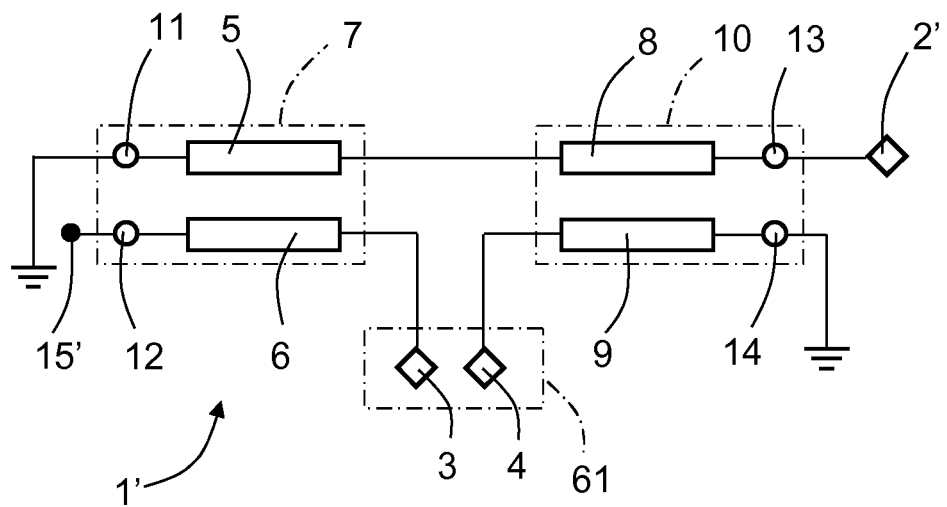
FIG. 8b shows a circuit diagram of a second balun arrangement according to the present disclosure.

The port configuration may be changed symmetrically, as shown in FIG. 8b that shows a circuit diagram of a second balun arrangement 1' according to the present disclosure. Here, for the first coupled pair 7, the first port 11 is connected to ground, and the second port 12 is connected to open circuit 15'; and for the second coupled pair 7, the first port 13 is connected to the single-ended port 2' and the second port 14 is connected to ground.

Figure 9:
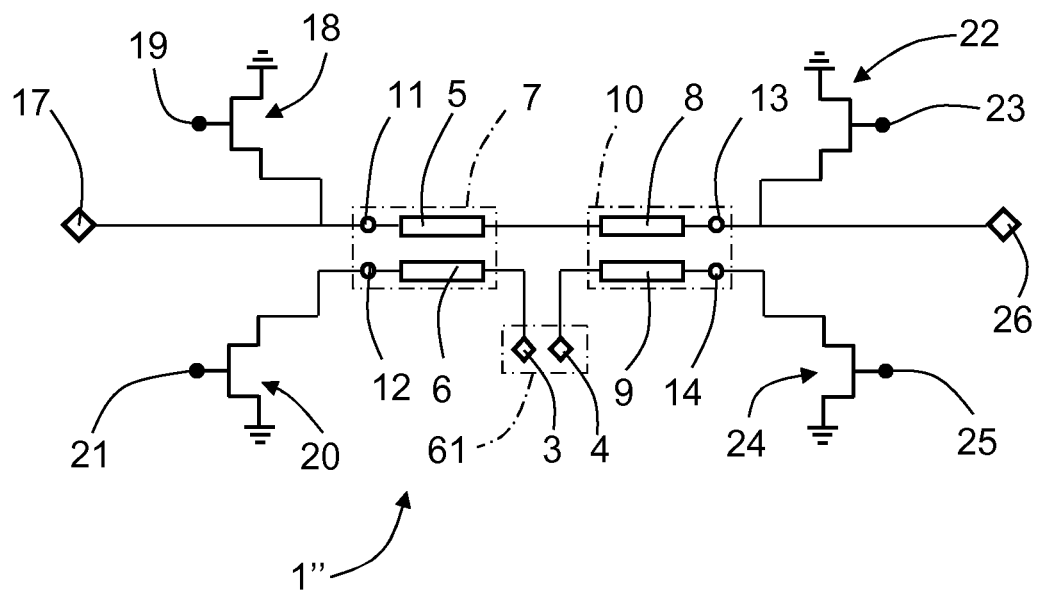
FIG. 9 shows a circuit diagram of a balun arrangement according to the present disclosure that comprises a transmit/receive switch.

With reference to FIG. 9, the symmetrical features mentioned above are used for a third balun arrangement 1". The third balun arrangement 1" comprises the first coupled pair 7, the second coupled pair, the differential port arrangement 61, a first switching arrangement 18, a second switching arrangement 20 a third switching arrangement 22 and a fourth switching arrangement 24.

For the first coupled pair 7, the first port 11 is connected to a first switch port 17 and the first switching arrangement 18. In a first switch state, the first switching arrangement 18 is arranged to switch the first port 11 and the first switch port 17 to open circuit 19, and, in a second switch state, to switch the first port 11 and the first switch port 17 to ground.

The second port 12 is connected to the second switching arrangement 20, and, in the first switch state, the second switching arrangement 20 is arranged to switch the second port 12 to ground, and, in the second switch state, to switch the second port 12 to open circuit 21.

For the second coupled pair 10, the first port 13 is connected to a second switch port 26 and the third switching arrangement 22. In the first switch state the third switching arrangement 22 is arranged to switch the first port 13 and the second switch port 21 to ground, and, in the second switch state, to switch the first port 13 and the second switch port 21 to open circuit 23.

The second port 14 is connected to the fourth switching arrangement 24, and, in the first switch state, the fourth switching arrangement 24 is arranged to switch the second port 14 to open circuit 25, and, in the second switch state, to switch the second port 14 to ground.

In the first switch state, a configuration corresponding to the first balun arrangement 1 is acquired, where the first switch port 17 constitutes the single-ended port. In the second switch state, a configuration corresponding to the second balun arrangement 1' is acquired, where the second switch port 26 constitutes the single-ended port.

In the first switch state, the second switch port 26 will be isolated from the first switch port 17, and, in the second switch state, the first switch port 17 will be isolated from the second switch port 26.

In other words, generally, with reference to FIG. 8a, FIG. 8b and FIG. 9:
- For one coupled pair 7, 10 out of the first coupled pair 7 and second coupled pair 10, the first port 11, 13 is connected to the single-ended port 2, 2'; 17, 26, and the second port 12, 14 is connected to ground.
- For the other coupled pair 10, 7 out of the first coupled pair 7 and second coupled pair 10, the first port 13, 11 is connected to ground, and the second port 14, 12 is connected to open circuit 15, 15'.

The term "connected to" is not restricted to a direct connection, but also to a connection via one or more components, such as a switching arrangement.

The above described third balun arrangement 1" is suitable for a compact realization on RFIC or MMIC with high-performance shunt switches. The insertion loss is similar to what can be achieved in a shunt switch and the isolation is substantially improved compared to the standard shunt switch.

The present disclosure enables the use of differential bi-directional input to high-performance front-end circuits and provides a compact, low loss, high isolation interface towards highly integrated beam-former circuits in CMOS and/or SiGe.

According to some aspects, the first switch port 17 is a transmitter port and the second switch port 26 is a receiver port, where, in the first switch state, the transmitter port 17 is connected to the differential port arrangement 61, and where, in the second switch state, the receiver port 21 is connected to the differential port arrangement 61. Then, the third balun arrangement 1" provides a transmit/receive switch for a differential bi-directional interface in a transmit/receive front-end arrangement, for example corresponding to the one described with reference to FIG. 1, with decreased loss.

Having a differential bi-directional interface in a front-end arrangement has several advantages; mainly simplified routing between a beam-former and a front-end. This could potentially enable a less complex PCB (Printed Circuit Board) where the number of low-loss board layers can be minimized. Furthermore, the beam-former used can be simplified by not requiring an on-chip balun. In effect, the output power of the beam-former can be substantially increased and the noise figure be decreased due to reduced loss in the transmit/receive switch.

According to some aspects, the switching arrangements 18, 20, 22, 24 are constituted by switching transistors and/or switching diodes and/or combinations of switching transistors and/or switching diodes. Switching transistors can for example be implemented using MESFET (Metal Semiconductor Field Effect Transistor), HEMT (High Electron Mobility Transistor), HBT (Heterojunction Bipolar Transistor), BJT (Bipolar Junction Transistor) or CMOS transistor technology. Switching diodes can for example be implemented using PIN diode technology.

Figure 10:
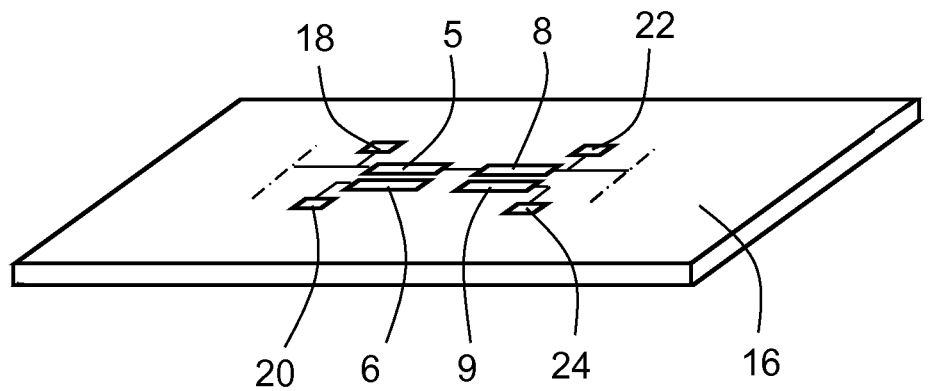
FIG. 10 shows a schematical perspective top view of a dielectric layer on which the balun arrangement according to FIG. 9 is formed such that the transmission line sections are constituted by microstrip transmission lines.

According to some aspects, with reference to FIG. 10, the transmission line sections 5, 6, 8, 9 are constituted by microstrip transmission lines formed on a dielectric layer 16 together with the switching arrangements 18, 20, 22, 24.

Figure 11:
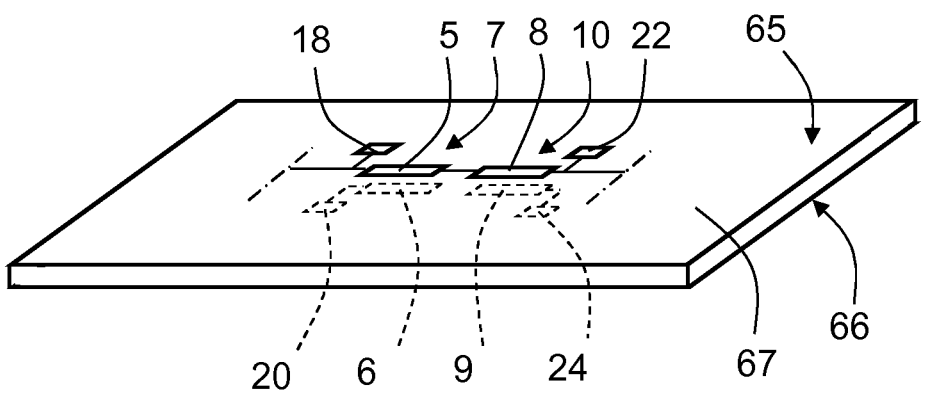
FIG. 11 shows a schematical perspective top view of a dielectric layer on which the balun arrangement according to FIG. 9 is formed such that the transmission line sections are positioned on opposite sides of the dielectric layer.

According to some aspects, with reference to FIG. 11, the coupled transmission line sections 5, 6, 8, 9 of each coupled pair 7, 10 are formed on opposite sides 65, 66 of a dielectric layer 67 together with the switching arrangements 18, 20, 22, 24.

Figure 12:
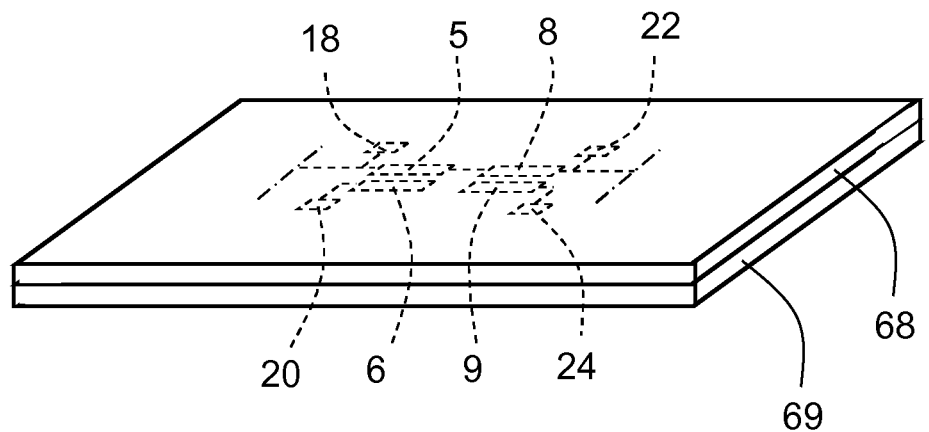
FIG. 12 shows a schematical perspective top view of two dielectric layers between which the balun arrangement according to FIG. 9 is formed such that the transmission line sections are constituted by stripline transmission lines.

According to some aspects, with reference to FIG. 12, the coupled transmission line sections 5, 6, 8, 9 are constituted by transmission lines formed in a stripline configuration, sandwiched between two dielectric layers 68, 69 together with the switching arrangements 18, 20, 22, 24.

The present disclosure is not limited to the example described above, but may vary freely within the scope of the appended claims. For example, first switching arrangement 18 and the third first switching arrangement 22 can be omitted in the third balun arrangement 1" with a maintained functionality, but with decreased isolation properties.

Figure 13:
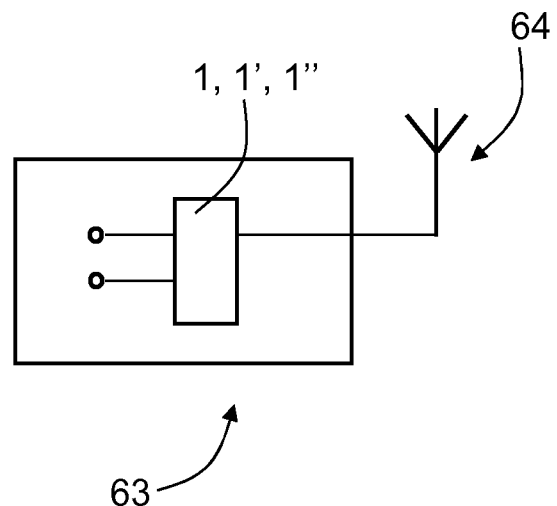
FIG. 13 shows a first transceiver device comprising a balun arrangement according to some aspects of the present disclosure.
Figure 14:
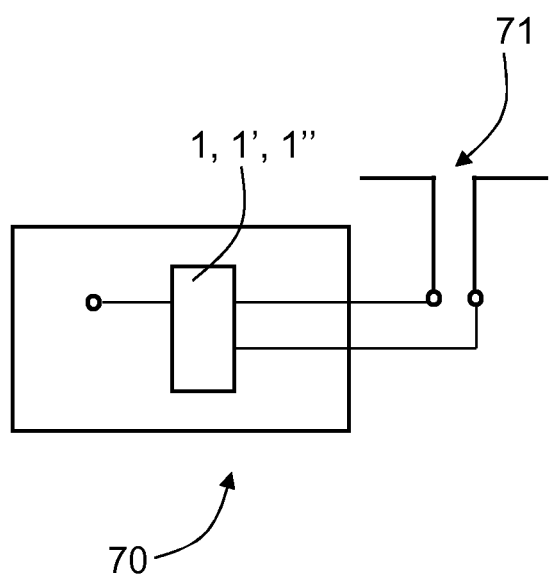
FIG. 14 shows a second transceiver device comprising a balun arrangement according to some aspects of the present disclosure.

A balun arrangement 1, 1', 1" can be comprised in any type of suitable transceiver device 63, 70 as shown in FIG. 13 and FIG. 14.

In FIG. 13, a first transceiver device 63 is arranged for transmitting and receiving electromagnetic waveforms via a single-ended feeding of an antenna arrangement 64, where the balun arrangement 1, 1', 1" constitutes a transmit/receive switch device.

In FIG. 14, a second transceiver device 70 is arranged for transmitting and receiving electromagnetic waveforms via a differential feeding of an antenna arrangement 71, where the balun arrangement 1, 1', 1" constitutes a transmit/receive switch device. The antenna arrangement 71 is here symbolized by a schematic dipole antenna.

Such a transceiver device 63, 70 can be a communications transceiver, a radar device, or any other device for transmitting and receiving electromagnetic waveforms via an antenna arrangement 64, 71.

According to some aspects, the transmission line sections 5, 6, 8, 9 are constituted by lumped components.

According to some aspects, the single-ended port 2, 2'; 17, 26 has a matched impedance.

The term quarter wavelength used in the description refers to a wavelength that corresponds to a center frequency of an operating frequency band.

It is to be noted that the devices described may comprise several more parts than shown; such as for example control voltage and supply voltage circuitry, control circuitry, DC (Direct Current) blocking components, AC (Alternating Current) blocking components and filter devices. This is common knowledge, and these parts are omitted for the sake of clarity when describing the present disclosure; only those parts and components necessary to provide a clear description of the present disclosure are shown and discussed. In this context, an antenna arrangement may comprise on or more antenna arrays, where each antenna array may comprise on or more antenna elements.

Generally, the present disclosure relates to a balun arrangement 1, 1', 1" comprising:
a single-ended port 2, 2'; 17, 26;
a differential port arrangement 61 comprising a first differential port 3 and a second differential port 4;
a first transmission line section 5 and a second transmission line section 6 which are electromagnetically mutually coupled such that a first coupled pair 7 is obtained; and
a third transmission line section 8 and a fourth transmission line section 9 which are electromagnetically mutually coupled such that a second coupled pair 10 is obtained;
where
the first transmission line section 5 is connected between a first coupled pair first port 11 and the third transmission line section 8;
the second transmission line section 6 is connected between a first coupled pair second port 12 and the first differential port 3;
the third transmission line section 8 is connected between a second coupled pair first port 13 and the first transmission line section 5; and
the fourth transmission line section 9 is connected between a second coupled pair second port 14 and the second differential port 4;
wherein
for one coupled pair 7, 10 out of the first coupled pair 7 and second coupled pair 10, the first port 11, 13 is connected to the single-ended port 2, 2'; 17, 26, and the second port 12, 14 is connected to ground; and
for the other coupled pair 10, 7 out of the first coupled pair 7 and second coupled pair 10, the first port 13, 11 is connected to ground, and the second port 14, 12 is connected to open circuit 15, 15'.

According to an example, the balun arrangement 1" further comprises a first switching arrangement 18, a second switching arrangement 20, a third switching arrangement 22 and a fourth switching arrangement 24; where, for the first coupled pair 7:
the first port 11 is connected to a first switch port 17 and the first switching arrangement 18 that is arranged to switch the first port 11 and the first switch port 17 to open circuit 19, in a first switch state, or to ground, in a second switch state; and
the second port 12 is connected to the second switching arrangement 20 that is arranged to switch the second port 12 to ground, in the first switch state, or to open circuit 21, in the second switch state;
and for the second coupled pair 10:
the first port 13 is connected to a second switch port 26 and the third switching arrangement 22 that is arranged to switch the first port 13 and the second switch port 21 to ground, in the first switch state, or to open circuit 23, in the second switch state; and
the second port 14 is connected to the fourth switching arrangement 24 that is arranged to switch the second port 14 to open circuit 25, in the first switch state, or to ground, in the second switch state,
such that, in the first switch state, the first switch port 17 constitutes the single-ended port, and, in the second switch state, the second switch port 26 constitutes the single-ended port.

According to an example, the switching arrangements 18, 20, 22, 24 are constituted by switching transistors and/or switching diodes and/or combinations of switching transistors and/or switching diodes.

According to an example, the first switch port 17 is a transmitter port and the second switch port 26 is a receiver port, where, in the first switch state, the transmitter port 17 is connected to the differential port arrangement 61, and where, in the second switch state, the receiver port 21 is connected to the differential port arrangement 61.

According to an example, the transmission line sections 5, 6, 8, 9 are constituted by microstrip transmission lines formed on a dielectric layer 16.

According to an example, the coupled transmission line sections 5, 6, 8, 9 of each coupled pair 7, 10 are formed on opposite sides 65, 66 of a dielectric layer 67 together with the switching arrangements 18, 20, 22, 24.

According to an example, the coupled transmission line sections 5, 6, 8, 9 are constituted by transmission lines formed in a stripline configuration, sandwiched between two dielectric layers 68, 69 together with the switching arrangements 18, 20, 22, 24.

Generally, the present disclosure also relates to a transceiver device 63, 70 comprising a balun arrangement 1, 1', 1" according to the above.

The invention claimed is:

1. A balun arrangement, comprising:
a single-ended port;
a differential port arrangement comprising a first differential port and a second differential port;
a first transmission line section and a second transmission line section which are electromagnetically mutually coupled such that a first coupled pair is obtained;
a third transmission line section and a fourth transmission line section which are electromagnetically mutually coupled such that a second coupled pair is obtained;
a first switching arrangement;
a second switching arrangement;
a third switching arrangement; and
a fourth switching arrangement;
wherein the first transmission line section is connected between a first coupled pair first port and the third transmission line section;
wherein the second transmission line section is connected between a first coupled pair second port and the first differential port;
wherein the third transmission line section is connected between a second coupled pair first port and the first transmission line section;
wherein the fourth transmission line section is connected between a second coupled pair second port and the second differential port;
wherein:
for one coupled pair out of the first coupled pair and second coupled pair, the first port is connected to the single-ended port and the second port is connected to ground; and
for the other coupled pair out of the first coupled pair and second coupled pair, the first port is connected to ground, and the second port is connected to open circuit;
wherein, for the first coupled pair:
the first port is connected to a first switch port and the first switching arrangement that is arranged to switch the first port and the first switch port to open circuit, in a first switch state, or to ground, in a second switch state; and
the second port is connected to the second switching arrangement that is arranged to switch the second port to ground, in the first switch state, or to open circuit, in the second switch state; and
wherein, for the second coupled pair:
the first port is connected to a second switch port and the third switching arrangement that is arranged to switch the first port and the second switch port to ground, in the first switch state, or to open circuit, in the second switch state; and
the second port is connected to the fourth switching arrangement that is arranged to switch the second port to open circuit, in the first switch state, or to ground, in the second switch state,
wherein, in the first switch state, the first switch port constitutes the single-ended port; and
wherein, in the second switch state, the second switch port constitutes the single-ended port.

2. The balun arrangement of claim 1, wherein the switching arrangements are constituted by switching transistors and/or switching diodes and/or combinations of switching transistors and/or switching diodes.

3. The balun arrangement of claim 1:
wherein the first switch port is a transmitter port and the second switch port is a receiver port;
wherein, in the first switch state, the transmitter port is connected to the differential port arrangement; and
wherein, in the second switch state, the receiver port is connected to the differential port arrangement.

4. The balun arrangement of claim 1, wherein the transmission line sections are constituted by microstrip transmission lines formed on a dielectric layer.

5. The balun arrangement of claim 1, wherein coupled transmission line sections of each coupled pair are formed on opposite sides of a dielectric layer together with the switching arrangements.

6. The balun arrangement of claim 1, wherein coupled transmission line sections are constituted by transmission lines formed in a stripline configuration, sandwiched between two dielectric layers together with the switching arrangements.

7. A transceiver device, comprising:
a balun arrangement, the balun arrangement comprising:
a single-ended port;
a differential port arrangement comprising a first differential port and a second differential port;
a first transmission line section and a second transmission line section which are electromagnetically mutually coupled such that a first coupled pair is obtained;
a third transmission line section and a fourth transmission line section which are electromagnetically mutually coupled such that a second coupled pair is obtained;
a first switching arrangement;
a second switching arrangement;
a third switching arrangement; and
a fourth switching arrangement;
wherein the first transmission line section is connected between a first coupled pair first port and the third transmission line section;
wherein the second transmission line section is connected between a first coupled pair second port and the first differential port;
wherein the third transmission line section is connected between a second coupled pair first port and the first transmission line section;
wherein the fourth transmission line section is connected between a second coupled pair second port and the second differential port;

wherein:
for one coupled pair out of the first coupled pair and second coupled pair, the first port is connected to the single-ended port and the second port is connected to ground; and
for the other coupled pair out of the first coupled pair and second coupled pair, the first port is connected to ground, and the second port is connected to open circuit;
wherein, for the first coupled pair:
the first port is connected to a first switch port and the first switching arrangement that is arranged to switch the first port and the first switch port to open circuit, in a first switch state, or to ground, in a second switch state; and
the second port is connected to the second switching arrangement that is arranged to switch the second port to ground, in the first switch state, or to open circuit, in the second switch state;
wherein, for the second coupled pair:
the first port is connected to a second switch port and the third switching arrangement that is arranged to switch the first port and the second switch port to ground, in the first switch state, or to open circuit, in the second switch state; and
the second port is connected to the fourth switching arrangement that is arranged to switch the second port to open circuit, in the first switch state, or to ground, in the second switch state;
wherein, in the first switch state, the first switch port constitutes the single-ended port; and
wherein, in the second switch state, the second switch port constitutes the single-ended port.

8. The transceiver device of claim 7, wherein the switching arrangements are constituted by switching transistors and/or switching diodes and/or combinations of switching transistors and/or switching diodes.

9. The transceiver device of claim 7:
wherein the first switch port is a transmitter port and the second switch port is a receiver port;
wherein, in the first switch state, the transmitter port is connected to the differential port arrangement; and
wherein, in the second switch state, the receiver port is connected to the differential port arrangement.

10. The transceiver device of claim 7, wherein the transmission line sections are constituted by microstrip transmission lines formed on a dielectric layer.

11. The transceiver device of claim 7, wherein coupled transmission line sections of each coupled pair are formed on opposite sides of a dielectric layer together with the switching arrangements.

12. The transceiver device of claim 7, wherein coupled transmission line sections are constituted by transmission lines formed in a stripline configuration, sandwiched between two dielectric layers together with the switching arrangements.

* * * * *